United States Patent [19]

Davies et al.

[11] 4,283,480

[45] Aug. 11, 1981

[54] PHOTOPOLYMERIZABLE COMPOSITIONS, METHODS FOR THEIR PREPARATION, AND METHODS FOR THEIR USE IN COATING SUBSTRATES

[75] Inventors: William D. Davies, Littleborough; Graham G. Skelhorne, Prestwich; John B. Warren, Malpas, all of England

[73] Assignee: Diamond Shamrock Industrial Chemicals Limited, Great Britain

[21] Appl. No.: 80,545

[22] Filed: Oct. 1, 1979

[30] Foreign Application Priority Data

Oct. 3, 1978 [GB] United Kingdom ............... 39149/78

[51] Int. Cl.³ ............................................. B05D 3/06
[52] U.S. Cl. ........................... 430/270; 204/159.19; 228/180 R; 228/214; 228/215; 427/54.1; 427/96; 427/433; 430/271; 430/284; 430/287
[58] Field of Search ............... 427/54.1, 44, 96, 433; 204/159.19; 430/314, 315, 271, 277, 270, 284, 287; 228/180 R, 180 A, 214, 215

[56] References Cited

U.S. PATENT DOCUMENTS

| Re. 29,131 | 2/1977 | Smith et al. |
|---|---|---|
| Re. 30,186 | 1/1980 | Rubner et al. ................ 430/284 |
| 3,297,745 | 1/1967 | Fekete ................................ 260/471 |
| 3,499,220 | 3/1970 | Hintz et al. |
| 3,526,504 | 9/1970 | Celeste |
| 3,629,036 | 12/1971 | Isaacson |
| 3,650,746 | 3/1972 | Bailey |
| 3,753,720 | 8/1973 | Kloczewski et al. ........... 204/159.15 |
| 3,824,104 | 7/1974 | Kloczewski et al. ........... 204/159.15 |
| 3,847,767 | 11/1974 | Kloczewski et al. ........... 204/159.15 |
| 3,850,770 | 11/1974 | Juna et al. ...................... 204/159.15 |
| 3,883,352 | 5/1975 | Kloczewski et al. ........... 204/159.15 |
| 3,989,610 | 11/1976 | Tsukada et al. ..................... 427/54.1 |
| 4,003,877 | 1/1977 | Lipsom et al. ................. 260/47 UA |
| 4,041,104 | 8/1977 | Selley |
| 4,064,287 | 12/1977 | Lipsom et al. ........................ 427/96 |
| 4,082,634 | 4/1978 | Chang .................................. 427/44 |
| 4,119,510 | 10/1978 | Williams ............................ 427/54.1 |
| 4,120,721 | 10/1978 | Ketley et al. ...................... 427/54.1 |
| 4,180,404 | 12/1979 | Ohmura et al. ...................... 430/284 |

FOREIGN PATENT DOCUMENTS

| 2284622 | 4/1976 | France . |
|---|---|---|
| 2284623 | 4/1976 | France . |
| 1251232 | 10/1971 | United Kingdom . |
| 2003494 | 3/1979 | United Kingdom . |
| 2012290 | 7/1979 | United Kingdom . |

*Primary Examiner*—John H. Newsome
*Attorney, Agent, or Firm*—Bacon & Thomas

[57] ABSTRACT

A photopolymerisable composition particularly useful as a solder resist composition able to withstand molten solder without loss of adhesion, pitmarks or shrinkage and for forming durable coatings on substrates generally is obtained by a combination of a photoinitiator, a polythiol acting as a chain modifier, and a polymer having hydroxy terminated chains capped by acrylate groups connected to the chains via the residue of a polyisocyanate.

8 Claims, No Drawings

PHOTOPOLYMERIZABLE COMPOSITIONS, METHODS FOR THEIR PREPARATION, AND METHODS FOR THEIR USE IN COATING SUBSTRATES

This invention concerns photopolymerisable compositions, and relates in preferred aspects to UV-curable urethane-acrylate-polymer coating compositions useful as solder-resists in the manufacture of printed circuits.

Various unsaturated polymerisable materials are known for use as the basic component of photopolymerisable compositions, as are various chain modifiers including certain types of polythiols. However the selection in combination of particular types of polymerisable material and, if used, chain modifier from the wide field available to obtain desired properties has been the subject of much investigation and effort.

The general concept of the use of resist coatings is well known, especially in the electronics industry. Basically, a substrate upon which an operation is to be performed is coated, possibly by a screen-printing technique, with a resist (a coating that will resist the changes to be affected by the coming operation), and the operation is then carried out. Sometimes the resist coating is then removed. There are more complicated utilisations of this basic technique, but whatever procedure is used it is of paramount importance that the resist coating can in fact stand up to the physical and/or chemical stresses involved in the operation to be performed upon the substrate, though naturally the necessary capabilities of the resist along these lines will depend upon exactly what operation is involved.

A typical operation carried out on substrates which are printed circuit boards for electronic apparatus is the soldering of some or all of the electronic components in place (and to the printed circuit elements) by such relatively novel techniques as "flow coat" soldering or "dip" soldering. In these techniques the printed circuit or obverse side of the substrate is resist coated wherever solder is not required, the circuit components are inserted (from the reverse side, with their connector elements projecting through to the obverse side), and the connectors are then soldered to the appropriate part of the circuit either by pouring molten solder over the obverse side or by dipping the obverse side into a bath of molten solder.

Molten solder is normally applied at a temperature of from 200° to 250° C.; it will be appreciated that the resist coating, which has to prevent solder adhering to the coated parts of the circuit, must be pretty tough to stand up to such treatment. We have now found that very successful resist coatings can be made from compositions based upon a radiation-curable unsaturated-urethane-polymer when these are subjected to UV-initiated cure polymerisation in situ in the presence of a chain modifier.

Photocurable compositions are however well known to have utility in many other fields and in particular may be used for forming cured coatings on substrates and for forming relief images by imagewise development which may be used in printing processes.

In one aspect, therefore, this invention provides a photopolymerisable liquid composition comprising a polymerisable component, a chain modifier and a photoinitiator capable of initiating polymerisation of the polymerisable component upon UV-irradiation, characterized in that the polymerisable component is a polymer having an average of at least two terminal groups per molecule, which groups provide ethylenic double bonds by which the polymer may be further polymerised and which groups are attached to the remainder of the polymer molecule by groups of the formula

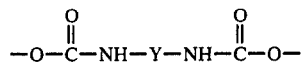

which are the residues of a polyisocyanate and in that the chain modifier is a polythiol.

The invention includes a method for preparing a polymerisable liquid composition which method comprises mixing together a polymerisable component, a chain modifier, and a photoinitiator capable of initiating polymerisation of the polymerisable component upon UV-irradiation, characterized in that the polymerisable component is a polymer having an average of at least two terminal groups per molecule, which groups provide ethylenic double bonds by which the polymer may be further polymerised and which groups are attached to the remainder of the polymer molecule by groups of the formula

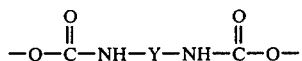

which are the residues of a polyisocyanate and in that the chain modifier is a polythiol.

The ethylenic double bonds are preferably provided by residues of acrylate or methacrylate compounds containing a function reactive with isocyanate. In the following description the term "acrylate-type" will be used for convenience to refer not only to compounds actually containing acrylate residues but also to compounds containing polymerisable double bonds derived from other unsaturated compounds capable of being linked to the polymer chains so that the whole can then be further polymerised (via the unsaturations) when mixed with a suitable photoinitiator and exposed to sufficient UV radiation. For example, the "acrylate-type" grouping might be derived from a maleate (or fumarate) or allyl compound. Nevertheless, in practice the very much preferred acrylate-type groupings are in fact those derived from acrylic acid itself.

The first main component of the composition is the polymerisable component which is preferably obtained by reacting a polyol (which term includes diols) with an excess of polyisocyanate (which term includes diisocyanates) to produce an isocyanate terminated polymer and reacting at least two isocyanate groups per polymer molecule with a compound containing an ethylenically unsaturated bond and a group reactive with isocyanate, e.g. an hydroxyalkyl acrylate or methacrylate.

The isocyanate terminated polymer may be a polyurethane obtained by reacting a relatively small excess of poly isocyanate with a polyol, which may then be a low molecular weight polyol. Preferably however the polyol is a polymeric polyol and an isocyanate terminated polymer can then be obtained by the use of a large excess of polyisocyanate to effectively "end cap" the polyol with isocyanate groups without further polymerisation. The isocyanate index of such a product would be greater than 200, e.g. 250.

The polyisocyanate may be any of the large number of possible polyisocyanates, and types of polyisocyanate, used or suggested for use in the preparation of polyurethanes. It may be an aromatic polyisocyanate, for example an aromatic di-isocyanate such as 2,4- or 2,6-toluene di-isocyanate (TDI), a xylylene di-isocyanate, bis(4-isocyanatophenyl) methane (MDI; 4,4'-diphenylmethane-di-isocyanate) or 1,5-naphthalene di-isocyanate. Alternatively, it may be an aliphatic polyisocyanate, for example an aliphatic (or cycloaliphatic) diisocyanate such as hexamethylene di-isocyanate (HDI), isophorone di-isocyanate (IPDI; 3-isocyanatomethyl-3,5,5-tri methyl-cyclohexyl isocyanate) or 4,4'-methylene bis cyclohexyl di-isocyanate (HMDI; hydrogenated MDI; bis(4-isocyanato cyclohexyl) methane; available as HYLENE W).

The polyisocyanate may, of course, be a mixture of two or more different compounds (indeed, most commercially-available polyisocyanates are such mixtures). The preferred polyisocyanates are the di-isocyanates, specifically TDI, IPDI and HMDI.

Similarly, the polyol may be any of the large number of possible polyols, and types of polyol, used or suggested for use in the preparation of polyurethanes. For example, the polyol may be a polyether glycol such as one of those of the polyoxyalkylene glycol variety. These are prepared by reacting an alkylene glycol (perhaps a diol such as ethylene glycol or propylene glycol, or a triol such as glycerol) with an alkylene oxide (usually ethylene or propylene oxide, sometimes alone, sometimes mixed, sometimes sequentially); the products with molecular weights in the range 200 to 3,000, especially those with equivalent weights in the range 100 to 400, are most useful. Typical such polyether polyols are those propylene oxide condensates available under the PROPYLAN Trade Mark, specifically.

G310 (a 300 mole wt triol based on glycerol),
D402 (a 400 mole wt diol based on propylene glycol), and
G600 (a 600 mole wt triol based on glycerol).

Another example of a suitable type of polyol is the polyester polyols. These are prepared by reacting a polycarboxylic acid (usually a dicarboxylic acid, such as an aromatic acid like phthalic or an aliphatic acid like adipic) with an excess of a polyhydroxylic compound (usually a diol, such as an alkylene diol like butane-1,4-diol) to form the desired hydroxy-terminated polyester; the products with a molecular weight in the range 500 to 5,000, especially those with an equivalent weight in the range 200 to 1,000, are the most useful.

Typical such polyester polyols are those available under the ESTOLAN Trade Mark, specifically:

P102 (a 1,000 mole wt linear butylene glycol adipate),
P91 (a 1,300 mole wt linear ethylene glycol adipate), and
P58 (a 2,000 mole wt linear ethylene/butylene glycol adipate).

Polyethers and polyesters are the two main classes of polyols used in polyurethane technology. However, other types of polyol are used, and are useful in the present invention. Thus, the polyol can be a polyoxyalkylene thioglycol analogue of the polyether polyols described above, it can be a hydroxy-terminated butadiene polymer (or perhaps a hydroxy-terminated copolymer of butadiene with, say, styrene or acrylonitrile), it can be a polyesteramide (the reaction product of a polycarboxylic acid, such as those described above in connection with polyester polyols, with a diamine or with an amine alcohol such as alkylene diamine, p-phenylene diamine, tolylene-2,4- or 2,6-diamine, ethanolamine or propanolamine), it can be a simple glycol (an aliphatic diol such as hexane-1,6-diol, for example) or it can be polycaprolactone (materials derived from the self-polymerisation or epsilon-caprolactone in the presence of a glycol initiator such as 1,2-ethylene diol) with molecular weights in the range 200 to 1,000.

The polyol may, of course, be a mixture of two or more different polyols.

The particularly preferred polyols are the glycol- or glycerol-based poly(propylene oxide) condensates (polyethers) with equivalent weights in the range 100 to 400.

The NCO-terminated urethane prepolymers are conveniently those of relatively low molecular weight and short chain length. The exact values chosen for these parameters in any given case will, of course, depend upon the particular polyisocyanate and polyol selected, but by way of indication it can be said that urethane prepolymers having an NCO-index of from 150 to 350, advantageously from 225 to 275, are generally preferred.

As explained above, the expression "acrylate-type" is used herein to extend beyond actual acrylate derivatives to other unsaturated-group-containing substances; nevertheless in practice the unsaturated substance is most preferably an acrylate, especially a hydroxy-alkyl acrylate; the particularly preferred hydroxy-alkyl acrylates are hydroxyethyl acrylate, hydroxypropyl acrylate, trimethylolpropane diacrylate and pentaerythritol triacrylate.

The amount of the polymerisable component employed in the composition depends primarily upon its molecular weight, its viscosity and its functionality—and upon the type of polyisocyanate upon which it is based. In general, however, it may be said that the compositions should contain from 30 to 90 wt %, preferably from 50 to 70 wt % (based on the total composition) of the polymerisable component.

The second main component of the composition is the polythiol chain modifier (which term includes dithiols). This material, acts as a further cross-linking agent during the cross-polymerisation of the composition during curing. It is desirable that the polythiol is reactive to double bonds only at its thiol groups so that if the polythiol is generally represented as Y—(SH)$_n$ where n is 2 or more, the moiety Y is preferably substantially inert to carbon-carbon unsaturation. The polythiol is preferably the ester of a polyhydroxylic alcohol and a mercapto fatty acid. The polyhydroxylic alcohols may be monomeric or polymeric, e.g. polyether polyols examples are trimethylolpropane, ethylene glycol and pentaerythritol. Typical mercapto fatty acids are thioglycollic and $\alpha$ and $\beta$ mercaptopropionic acid. The preferred thiol-group-containing esters are thus pentaerythritol tetrathioglycollate and (especially) pentaerythritol tetramercaptopropionate.

Whilst the esters of mercapto fatty acids are preferred, other known chemical equivalent polythiols may be used. For example, aliphatic monomeric polythiols such as ethane dithiol, hexamethylene dithiol, decamethylene dithiol and tolylene-2,4-dithiol may be used as well as polymeric materials such as thiol terminated ethylcyclohexyl dimercaptan polymer although these materials may have an odour which is not acceptable in some circumstances.

Another type of polythiol which is useful in composition of the invention is illustrated by Diamond Shamrock CAPCURE 3-800, a mercapton-terminated liquid polymer having the general structure

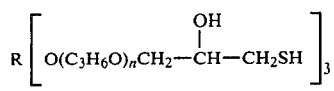

where R is aliphatic hydrocarbon and n is 1 to 2.

The amount of thiol-group-containing ester employed in the composition depends primarily upon the molecular weight and functionality of the urethane-acrylate-type component. In general, however, it may be said that the compositions should contain from 0.5 to 10 wt %, preferably from 3 to 6 wt % (based on the total composition), of the ester.

The third main component of the composition is the photoinitiator. When applied, the UV-curable composition is cured by exposure to UV radiation; this activates the incorporated photoinitiator to start the cross-linking (curing) reaction. The radiation spectrum intended by the expression "UV" is generally that of wavelengths from 180 nm to 500 nm, especially from 250 nm to 450 nm. Naturally the photoinitiator employed will be one which satisfactorily responds to the radiation employed, and in general any of those materials used, or suggested for use, in the art will suffice. The preferred photoinitiators are of the benzophenone type—thus, benzophenone itself, 2-chlorothioxathone (sold as QUANTACURE CTX) and dibenzosuberone (sold as QUANTACURE DBS)—but one can also use the related benzoin (1-phenyl-1-hydroxy-acetophenone) type materials—such as TRIGONAL 14 (believed to be a mixture of butyl benzoin ethers) and IRGACURE 651 (1-phenyl-1,1-dimethoxy-acetophenone).

The amount of photoinitiator need only be sufficient to ensure that upon exposure to UV radiation the composition is cured within a reasonable time—thus, for example, that upon exposure enough free radicals are generated to cause complete cross-linking of the polymer in a few seconds. Suitable amounts of photoinitiator are from 1 to 10 wt % (based on the total composition), particularly preferred amounts being from 3 to 5 wt %.

Naturally, the compositions of the invention may also be curable by using non-UV actinic light and will generally be curable by electron beams or high energy radiation such as X-rays. For curing by electron beam and high energy radiation, the photoinitiator could be omitted.

The UV-curable compositions of the invention may contain various additional ingredients intended to improve or modify their characteristics.

For example, they may contain, as a fourth main component, a liquid diluent. The UV-curable compositions as so far described will usually be very viscous at room temperature. In most cases this will not be satisfactory, and in these it will be desirable to reduce the composition's viscosity. Such a lower viscosity composition may conveniently be obtained (from a composition which is itself too viscous at room temperature) by mixing the latter with a diluent/solvent to produce the lower viscosity composition. By way of example, a typical urethane-acrylate-type polymer composition as originally formed might have 25° C. viscosity of around 1,000,000 cps, and would need diluting at least to a viscosity of 50,000 cps. It is very advantageous if the diluents/solvents are those organic compounds containing one or more "ethylenic" double bonds. Typical "ethylenic" compounds are N-vinyl pyrrolidone and styrene, acrylonitrile and methacrylonitrile, and a number of alkenoates, specifically mono-, di-, tri-, or tetrafunctional acrylates or methacrylates (for example, the alkyl esters such as the methyl, ethyl or epoxypropyl esters, or hexanediol diacrylate or trimethylolpropane triacrylate). It is possible to use, as the ethylenic diluent/solvent, materials of the hydroxyalkyl acrylate-type—for example, hydroxy-ethyl acrylate or hydroxypropyl methacrylate. Mixtures of these materials can of course be employed.

It is interesting to note that the final cured compositions are somewhat harder and tougher if the reactive diluent/solvent employed is double or triple unsaturated—and is, for example, hexane diol diacrylate or trimethylolpropane triacrylate.

The amount of diluent/solvent employed will naturally depend upon the viscosity of the undiluted composition, the thinning ability of the chosen diluent/solvent, and the final viscosity required for the composition. In general, the final viscosity of the composition to be applied to a printed circuit will be at least 20,000 centipoises and may be as high as 100,000 centipoises or more; preferably the viscosity will be within the range 30,000 to 50,000 centipoises. The compositions may contain from 25 to 75 wt %, preferably from 35 to 45 wt % (based upon the total composition) of the liquid reactive diluent.

The composition may also contain one or more flow promoting agents to regulate their ability to coat, and a typical such flow promoting agent is the acrylic-resin-based material sold by Monsanto as MODAFLOW, which is used at a level of from 0.2 to 2 wt %, preferably about 1.4 wt %, based upon the total composition.

The compositions may also contain a matting/flatting/filling agent intended to reduce the cost of the system and to cause the finished, cured coating to have a matt surface. Typical fillers are talc, powdered chalk and powdered gypsum, and these are conveniently used in amounts from 10 to 40 wt %, preferably 20 to 30 wt %, based upon the total composition.

The compositions may also contain pigment; it is usual in the art for solder-resist compositions to be coloured, often green, so that they may clearly be seen. A typical pigment, for example Vynamon Green 6Y (a product of Imperial Chemical Industries Limited), may be employed in an amount of from 0.2 to 2 wt % (based upon the total composition).

Finally, in order that they should have the best pot life the compositions may also contain a polymerisation inhibitor—specifically, a free-radical scavenger such as quinol, employed in an amount of from 0.005 to 1.0 wt %, preferably from 0.2 to 0.5 wt %, based upon the total composition.

The following Examples and Test Results are now given, though only by way of illustration, to show details of various embodiments of the invention.

EXAMPLE 1

Formulation and use of a urethane-acrylate solder-resist coating composition (A) Preparation of the urethane-acrylate polymer 200 parts by weight of PROPYLAN G600 (a 600 mole weight polyether triol based upon propylene oxide and glycerol) were reacted with 327.5 parts by weight of HYLENE W to produce an isocyanate-tipped urethane prepolymer (NCO-index=250). The free isocyanate groups were then capped with hydroxyethyl acrylate to produce the desired urethane-acrylate polymer, designated "Resin A".

(B) Preparation of the solder-resist coating composition

The formulation of the following ingredients into the desired composition was effected by two passes through a triple roll milling, the ingredients initially being mixed by hand.

| Ingredient | | Parts by Weight |
| --- | --- | --- |
| Urethane-acrylate | (Resin A) | 100 |
| Chain modifier | (pentaerythritol tetra-mercapto-propionate) | 8 |
| Liquid reactive | (hexane diol diacrylate) | 20 |
| diluents | (trimethylol propane) (triacrylate) | 80 |
| Photoinitiator | (IRGACURE 651) | 8 |
| Filler | (French Chalk) | 50 |
| Pigment | (Vynamon Green 6Y) | 2.5 |
| Flow out aid | (MODAFLOW) | 2.5 |
| Inhibitor | (Quinol) | 0.1 |

(C) Use of the solder-resist coating composition

The formed composition was screen-printed (using a 60/cm mesh screen) onto copper-clad printed circuit boards. The film was cured by passing under a 200 watt/inch medium pressure mercury lamp at 15 ft/min. The cured film was subjected to a 5 second dip in flux (with a 30 second drying period at 40° C.) then dipped in molten solder at 260° C. for 10 seconds. The film remained intact during this treatment; subsequent examination revealed that the film showed no signs of loss of adhesion, pitmarks or shrinkage.

(D) Comparison

In exactly the same way there was prepared an identical composition save that it contained no chain modifier. The cured coating prepared therefrom showed severe bubbling and peeling after the solder test.

EXAMPLES 2-4

Example 1 was repeated, except that:
(2) in Example 2, the trimethylolpropane triacrylate reactive diluent was replaced entirely by hexanediol diacrylate;
(3) in Example 3 no filler was used;
(4) in Example 4, all the hexanediol diacrylate was replaced by a mono-functional acrylate diluent—a (phenol+4 moles of ethylene oxide) acrylate.

The three compositions of Examples 2 to 4 were tested (as in Example 1), and found to be satisfactory. The three Comparison compositions (without chain modifier) were unsatisfactory.

EXAMPLE 5

Formulation and use of a urethane-acrylate solder resist coating composition (A) Preparation of the urethane-acrylate polymer 200 parts by weight of PROPYLAN D402 (a 400 mole weight polyether diol, based upon propylene oxide and propylene glycol) were reacted with 327.5 parts by weight of HYLENE W to produce an isocyanate-tipped urethane prepolymer (NCO-index=250). The free isocyanate groups were then capped with hydroxyethyl-acrylate to produce the desired urethaneacrylate polymer, designated "Resin B".

(B) Preparation of the solder-resist coating composition

The following materials were mixed together (in the manner described in Example 1).

| Ingredient | | Parts by Weight |
| --- | --- | --- |
| Urethane-acrylate | (Resin B) | 100 |
| Chain modifier | (pentaerythritol tetra-mercapto-propionate) | 8 |
| Liquid reactive | (hexanediol diacrylate) | 30 |
| diluents | (trimethylolpropane (triacrylate) | 80 |
| Photoinitiator | (IRGACURE 651) | 8 |
| Filler | (French chalk) | 50 |
| Pigment | (Vynamon Blue B) | 2.5 |
| Flow out aid | (MODAFLOW) | 2.5 |
| Inhibitor | (Quinol) | 0.1 |

(C) Use of the solder-resist composition

The formed composition was tested (as in Example 1) and found to be satisfactory; the corresponding Comparison composition lacking the chain modifier gave unsatisfactory results.

EXAMPLE 6

Example 5 was repeated, save that pentaerythritol tetrathioglycollate was used as the chain modifier in the formulation of the coating composition instead of tertramercaptopropionate.

The composition was tested (as in Example 1) and found satisfactory, while the Comparison composition (no chain modifier) was not.

EXAMPLE 7

Preparation and use of a urethane-acrylate solder-resist coating composition (A) Preparation of the urethane-acrylate polymer 200 parts by weight of PROPYLAN G600 (see Example 1) were reacted with 217 parts by weight of TDI to form a urethane-prepolymer with free isocyanate groups (NCO-index=250). The free NCO groups were then capped with hydroxyethyl acrylate to give the desired urethane-acrylate polymer designated "Resin C".

(B) Preparation of the solder-resist coating composition

The following components were mixed together (in the manner described in Example 1).

| Ingredient | | Parts by Weight |
| --- | --- | --- |
| Urethane-acrylate | (Resin C) | 100 |
| Chain modifier | (pentaerythritol tetra-mercapto propionate) | 8 |
| Liquid reactive | (hexanediol diacrylate) | 30 |
| diluents | (trimethylol propane) (triacrylate) | 80 |
| Photoinitiator | (IRGACURE 651) | 8 |
| Filler | (barium sulphate) | 50 |
| Pigment | (Vynamon Green 6Y) | 2.5 |
| Flow out aid | (MODAFLOW) | 2.5 |
| Inhibitor | (Quinol) | 0.1 |

(C) Use of the solder-resist coating composition

The formed composition was tested (as in Example 1), and was found to be satisfactory. The identical composition but without any chain modifier was not satisfactory.

EXAMPLE 8

Example 7 was repeated, save that the hexanediol diacrylate was replaced by a different difunctional diluent [(bisphenol+4 moles ethylene oxide) diacrylate], and the trimethylolpropane triacrylate was replaced by a different trifunctional diluent [(trimethylolpropane+3 moles propylene oxide) triacrylate].

The prepared coating composition was tested (as in Example 1), and performed satisfactorily; a Comparison composition (with no chain modifier) did not.

EXAMPLE 9

Preparation and use of a urethane-acrylate solder-resist coating composition

A urethane-acrylate polymer (Resin D) was prepared by the reaction of 200 parts by weight of PROPYLAN D402 (see example 5) with 278 parts by weight of IPDI to form an isocyanate-tipped urethane prepolymer (NCO-index=250). The free NCO groups were then capped with hydroxyethyl acrylate.

Resin D was incorporated into the same formulation as in Example 1 (Resin D replaced Resin A). On testing (as in Example 1) the prepared coating composition performed satisfactorily, but the performance of the Comparison composition (without any chain modifier) was unacceptable.

It is to be understood, however, that the invention also include compositions suitable for use in coating compositions which comprise the chain modifier (ingredient b), as described above in combination with either one of the above-described ingredients (a) or (c).

Although the compositions described in Examples 1 to 9 are described particularly with reference to their use as solder resists, it should be understood that they are also useful as coating compositions for forming coatings on various substrates such as wood, glass, metal, ceramic, concrete, brick, paper and cardboard.

EXAMPLE 10

Formulation and use of a urethane acrylate wood coating composition

A. Preparation of the urethane-acrylate polymer

An NCO-tipped urethane prepolymer having an NCO index of 200 was prepared by reacting 50 parts by weight of Propylan D1002 (a 1000 mole weight polyether diol based upon propylene oxide and tripropylene glycol) with 17.4 parts by weight of TDI. The prepolymer was then reacted with a stoichiometric amount of hydroxyethyl acrylate to produce the desired urethane acrylate which was then admixed with 25 parts by weight of trimethylol propane triacrylate (as reactive diluent). The resulting composition was designated "Resin E".

B. Preparation of the wood coating composition

The formulation of the folling ingredients into the desired composition was effected by use of a high speed mixer, the ingredients initially being mixed by hand.

| Ingredient | | Parts by Weight |
|---|---|---|
| Urethan acrylate | (Resin E) | 50 |
| Chain modifier | (pentaerythritol tetra-mercapto- | 3 |

-continued

| Ingredient | | Parts by Weight |
|---|---|---|
| | propionate) | |
| Liquid reactive diluent | (tripropylene glycol diacrylate) | 50 |
| Photoinitiators | (benzophenone) | 3 |
| | (IRGACURE 651) | 2 |
| Co-initiator | (methyl diethanolamine) | 2 |
| Matting agent | (GASIL EBC) | 10 |
| Flow out aid | (MODAFLOW) | 1 |
| Inhibitor | (Quinol) | 0.1 |

C. Use of the wood coating composition

The formed composition was 'K-bar' coated onto flush wooden door panels to a weight of ca. 25 g m$^{-2}$. The film was cured by passing under 2, 200 watt inch$^{-1}$ medium pressure mercury lamps at 40 ft min$^{-1}$. The cured film thus produced was extremely tough and scratch-resistant.

D. Comparison

In exactly the same way there was prepared an identical composition save that it contained no chain modifier (PTMP). The coating derived therefrom was much less resistant to scratching when cured under the same conditions.

We claim:

1. A process for soldering electrical components on a circuit board which comprises protecting areas of the board by applying thereto a photopolymerisable liquid composition which on curing forms a solder resist and which comprises a polymerisable component which is a polymer having an average of at least two terminal groups per molecule, which groups provide ethylenic double bonds by which the polymer may be further polymerised and which groups are attached to the remainder of the polymer molecule by groups of the formula:

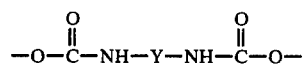

which are the residues of a polyisocyanate, a polythiol as a chain modifier, and a photoinitiator capable of initiating polymerisation of the polymerisable component upon UV-irradiation, curing the composition to form the solder resist and soldering electrical components to the protected areas of the board.

2. A process as claimed in claim 1 wherein the polythiol is a thiol-group containing ester of a polyhydric alcohol and a mercapto fatty acid.

3. A process as claimed in claim 2 wherein the polymerisable component is a polymer produced by reacting a polyol with an excess of polyisocyanate to form an isocyanate terminated polymer and reacting at least two terminal isocyanate groups per molecule with a compound containing an ethylenically unsaturated bond and a group reactive with isocyanate.

4. A process as claimed in claim 3 wherein the polyol is a hydroxy terminated polymer selected from the group consisting of hydroxy terminated polyester, polyether, polymerised or copolymerised butadiene, polyesteramide or polycaprolactone.

5. A process as claimed in claim 3 wherein the groups providing the said ethylenically unsaturated groups are the residues of compounds selected from the group consisting of acrylate and methacrylate compounds containing a function reactive with isocyanate.

6. A process as claimed in claim 3 wherein the composition further comprises a reactive diluent.

7. A process as claimed in claim 2 wherein the polymerisable component is a polymer selected from the group consisting of polyethers and polyesters and has at least two terminal groups of the formula

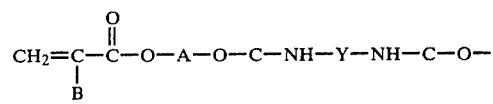

wherein A is a divalent carbohydryl radical, B is selected from the group consisting of hydrogen and alkyl, and

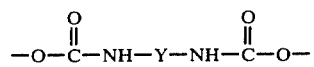

is the residue of a polyisocyanate.

8. A circuit board for mounting electrical components thereon by soldering and having areas protected by a solder resist coating formed by curing a composition comprising a polymerisable component which is a polymer having an average of at least two terminal groups per molecule, which groups provide ethylenic double bonds by which the polymer may be further polymerised and which groups are attached to the remainder of the polymer molecule by groups of the formula:

$$-O-\overset{O}{\underset{\|}{C}}-NH-Y-NH-\overset{O}{\underset{\|}{C}}-O-$$

which are the residues of a polyisocyanate, a polythiol as a chain modifier, and a photo initiator capable of initiating polymerisation of the polymerisable component upon UV-irradiation applied to predetermined areas of the board.

* * * * *